(12) United States Patent
Sasaki (10) Patent No.: US 8,325,070 B2
(45) Date of Patent: Dec. 4, 2012

(54) INFORMATION PROCESSING APPARATUS AND CONTROL METHOD THEREOF, AND STORAGE MEDIUM

(75) Inventor: Hidemi Sasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 13/018,571

(22) Filed: Feb. 1, 2011

(65) Prior Publication Data

US 2011/0205091 A1 Aug. 25, 2011

(30) Foreign Application Priority Data

Feb. 25, 2010 (JP) ................................ 2010-041002

(51) Int. Cl.
H03M 7/34 (2006.01)
(52) U.S. Cl. ........................................... 341/51; 341/50
(58) Field of Classification Search .................... 341/50, 341/51, 106, 65, 67
See application file for complete search history.

(56) References Cited

U.S. PATENT DOCUMENTS

| 6,879,271 B2* | 4/2005 | Abdat ............................. 341/87 |
| 7,728,745 B2* | 6/2010 | Shigenobu et al. ............. 341/67 |
| 7,880,647 B1* | 2/2011 | Sun ................................. 341/65 |
| 8,077,064 B2* | 12/2011 | Korodi et al. ................. 341/107 |
| 8,185,804 B2* | 5/2012 | Guo et al. ..................... 714/776 |
| 2010/0010995 A1* | 1/2010 | Fablet et al. ..................... 707/6 |

FOREIGN PATENT DOCUMENTS

JP 2001-267930 A 9/2001

* cited by examiner

*Primary Examiner* — Peguy Jean Pierre
(74) *Attorney, Agent, or Firm* — Fitzpatrick, Cella, Harper & Scinto (57) ABSTRACT

An apparatus which efficiently decompresses encoded data based on dictionary method, by suppressing the number of times of processing of registration in a character string table used as a dictionary. A buffer controller stores a codeword in a buffer until a clear code or an end code is input. When a clear code or an end code is input, the buffer controller specifies a codeword referring a table among codes in the buffer and generates identification information to specify a codeword as a subject of registration in the table. During decoding processing, a table controller determines whether or not a codeword from the buffer is the subject of registration in the table. When the codeword is the subject of registration, the table controller registers a new character string, obtained by adding a head character of a currently decoded character string to a previously decoded character string, in the table.

8 Claims, 10 Drawing Sheets

TEMPORARY BUFFER

| No. | LZW CODE | Index | USE DETERMINATION RESULT |
|---|---|---|---|
| No.1 | 65 | – | |
| No.2 | 66 | 258 | Yes |
| No.3 | 258 | 259 | |
| No.4 | 67 | 260 | Yes |
| No.5 | 260 | 261 | |
| No.6 | 67 | 262 | |
| No.7 | 260 | 263 | |
| No.8 | 258 | 264 | |

CHARACTER STRING TABLE

| CURRENT OUTPUT CHARACTER STRING | PREVIOUS OUTPUT CHARACTER STRING | HEAD CHARACTER OF CURRENT OUTPUT CHARACTER STRING | ENTRY NUMBER | REGISTERED CHARACTER STRING |
|---|---|---|---|---|
| A | | | | |
| B | A | B | 258 | AB |
| AB | B | – | 259 | – |
| C | AB | C | 260 | ABC |
| ABC | C | – | 261 | – |
| C | ABC | – | 262 | – |
| ABC | C | – | 263 | – |
| AB | ABC | – | 264 | – |

ABABCABCCABCAB

FIG. 3B

TEMPORARY BUFFER

| No. | LZW CODE | Index | USE DETERMINATION RESULT | NUMBER OF OUTPUT CHARACTERS | NUMBER OF REGISTERED CHARACTERS |
|---|---|---|---|---|---|
| No.1 | 65 | – | | 1 | |
| No.2 | 66 | 258 | Yes | 1 | 2 |
| No.3 | 258 | 259 | | 2 | |
| No.4 | 67 | 260 | Yes | 1 | 3 |
| No.5 | 260 | 261 | | 3 | |
| No.6 | 67 | 262 | | 1 | |
| No.7 | 260 | 263 | | 3 | |
| No.8 | 258 | 264 | | 2 | |
| | | | SUM | 14 | |

CHARACTER STRING TABLE

| CURRENT OUTPUT CHARACTER STRING | PREVIOUS OUTPUT CHARACTER STRING | HEAD CHARACTER OF CURRENT OUTPUT CHARACTER STRING | ENTRY NUMBER | REGISTERED CHARACTER STRING |
|---|---|---|---|---|
| A | | | | |
| B | A | B | 258 | AB |
| AB | B | – | 259 | – |
| C | AB | C | 260 | ABC |
| ABC | C | – | 261 | – |
| C | ABC | – | 262 | – |
| ABC | C | – | 263 | – |
| AB | ABC | – | 264 | – |

ABABCABCCABCAB

INFORMATION PROCESSING APPARATUS AND CONTROL METHOD THEREOF, AND STORAGE MEDIUM

BACKGROUND OF THE INVENTION

1. Field of the Invention

The present invention relates to a decompression technique for decompressing data compressed by using a compression technique based on dictionary method.

2. Description of the Related Art

In recent years, the amount of data to represent an image, a character and the like is becoming larger, and data compression is performed for the purpose of storage and transmission. For example, an LZW compression technique is known in Japanese Patent Application Laid-Open No. 2001-267930.

The above-described LZW is an improved LZ78 type compression technique, and these compression techniques are called compression techniques based on dictionary method. Generally, when this type of encoded data is decompressed, it is necessary to perform processing of sequentially registering a character string, which might be restored, in a "dictionary (table)". However, since a character string potentially restored is registered in the dictionary, such character string registered in the dictionary is not necessarily utilized. That is, the technique is still susceptible to improvement in terms of efficiency in use of the dictionary, i.e., reduction of memory capacity consumption.

SUMMARY OF THE INVENTION

The present invention provides a technique of suppressing the number of times of processing related to inefficient registration in a character string table used as a dictionary as described above, thereby efficiently decompressing encoded data compressed using the compression technique based on dictionary method.

The present invention provides an information processing apparatus which processes data encoded using a coding algorithm to convert a coding subject character string into a codeword by referring to a character string table, comprising: an input unit to input the encoded data; a specifying unit to specify a codeword included in the inputted encoded data among codewords to be registered in a character string table upon coding; and an output unit to output information indicating the specified result by the specifying unit before decoding of the encoded data.

According to the present invention, as the number of times of processing related to inefficient registration in the character string table used as a dictionary is suppressed, it is possible to efficiently decompress a code encoded by using a compression technique based on dictionary method.

Further features of the present invention will become apparent from the following description of exemplary embodiments (with reference to the attached drawings) applied to the present embodiment.

DESCRIPTION OF THE EMBODIMENTS

Hereinbelow, a preferred embodiment of the present invention will be described in detail with reference to the attached drawings.

Figure 1:
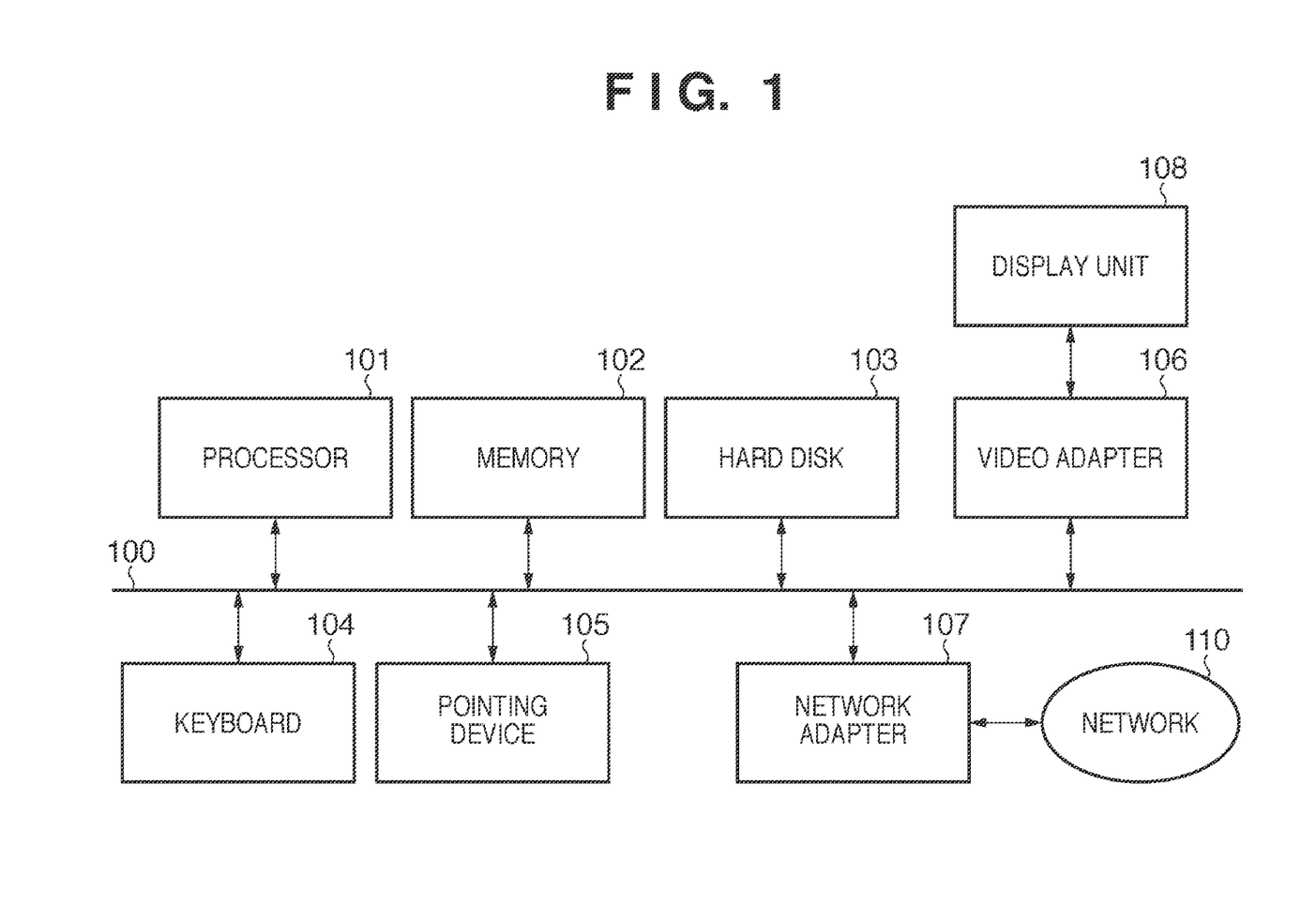
FIG. 1 is a block diagram showing a hardware configuration.

FIG. 1 shows an example of a configuration of an information processing apparatus (image decoding apparatus). In FIG. 1, a processor 101 is connected to a memory 102, a hard disk 103, a keyboard 104, a pointing device 105, a video adapter 106 and a network adapter 107 through a bus 100. Further, the video adapter 106 is connected to a display unit 108. The processor 101 controls the above-described respective constituent elements in accordance with a computer program corresponding to a processing procedure stored in the memory 102 e.g. a processing procedure to be described later. An OS (Operating System), an application program for decompression processing in the present embodiment are loaded into the memory 102, and executed with the processor 103. Further, the memory 102 is also utilized for temporary storage of various data and table. The hard disk 103 holds the computer program which the present system requires in the present embodiment and various data. A user can input information into the present system using the keyboard 104 and the pointing device 105. The video adapter 106 displays various information on the display unit 108. Further, this system, connectible to an external device via the network adapter 107 and a network 110, can transmit/receive various data to be described later with the external device. Note that LZW code data (file) as a subject of decompression and various data necessary for decompression are stored in the hard disk 103. Then, the data stored in the hard disk 103 is read to the memory 102 in accordance with necessity and processed with the processor 101. Note that the above-described respective processing units 101 to 108 are included in an integral type device. However, the present invention is applicable to a system in which the above-described respective units exist as individual devices and the units operate in cooperation.

Figure 2A:
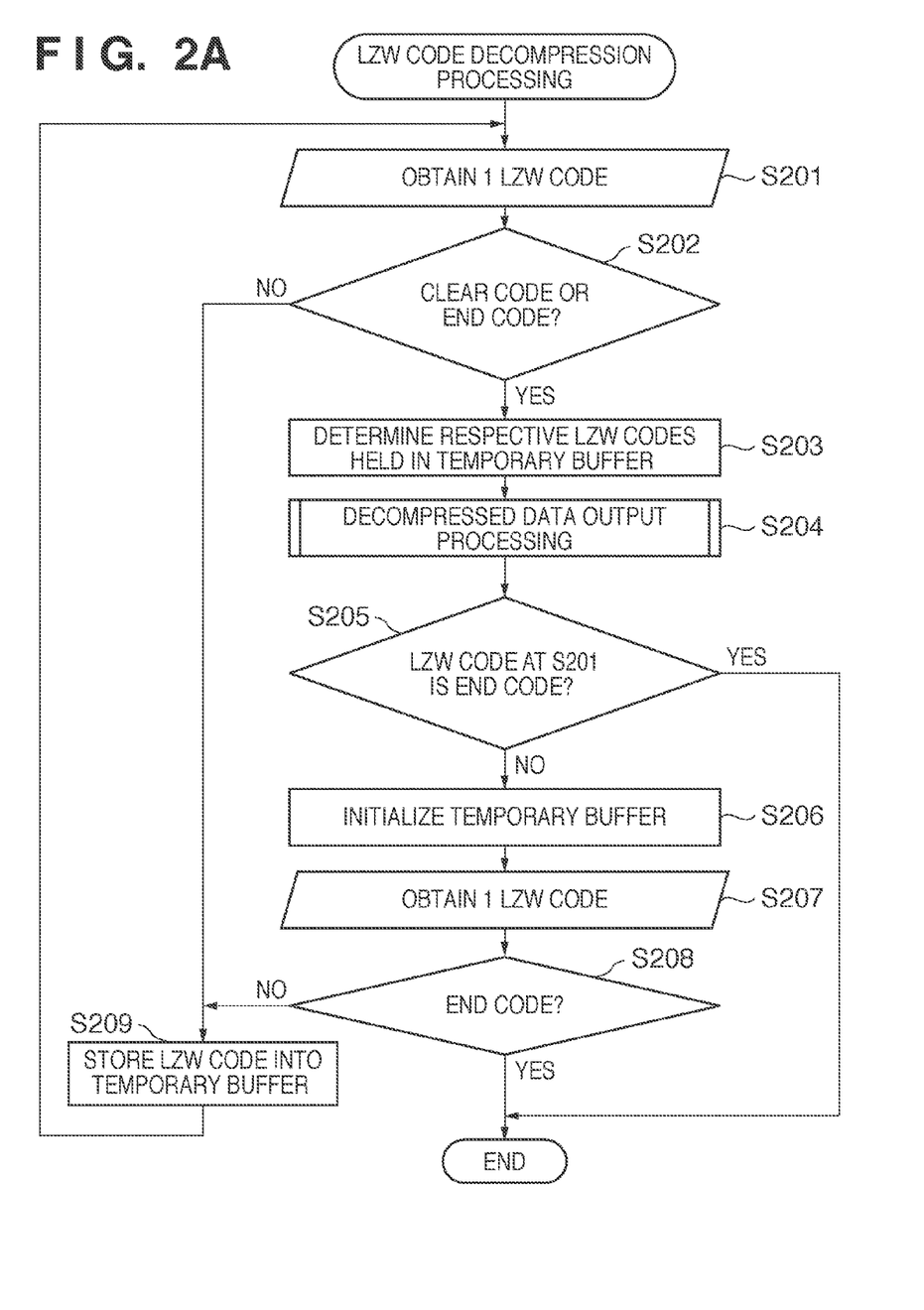
FIGS. 2A and 2B are flowcharts showing procedures of LZW code decompression processing.
Figure 2B:
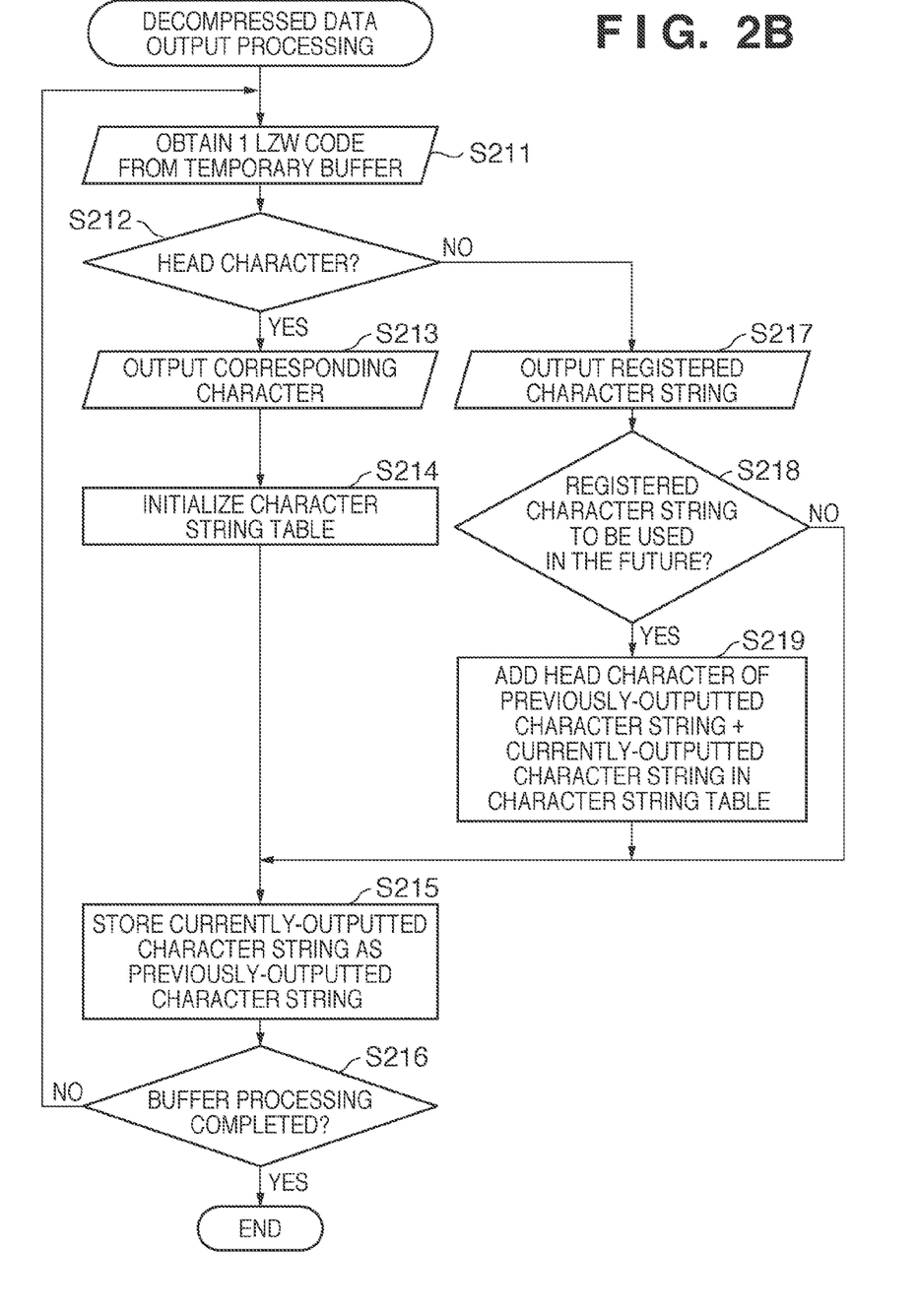
Figure 3A:
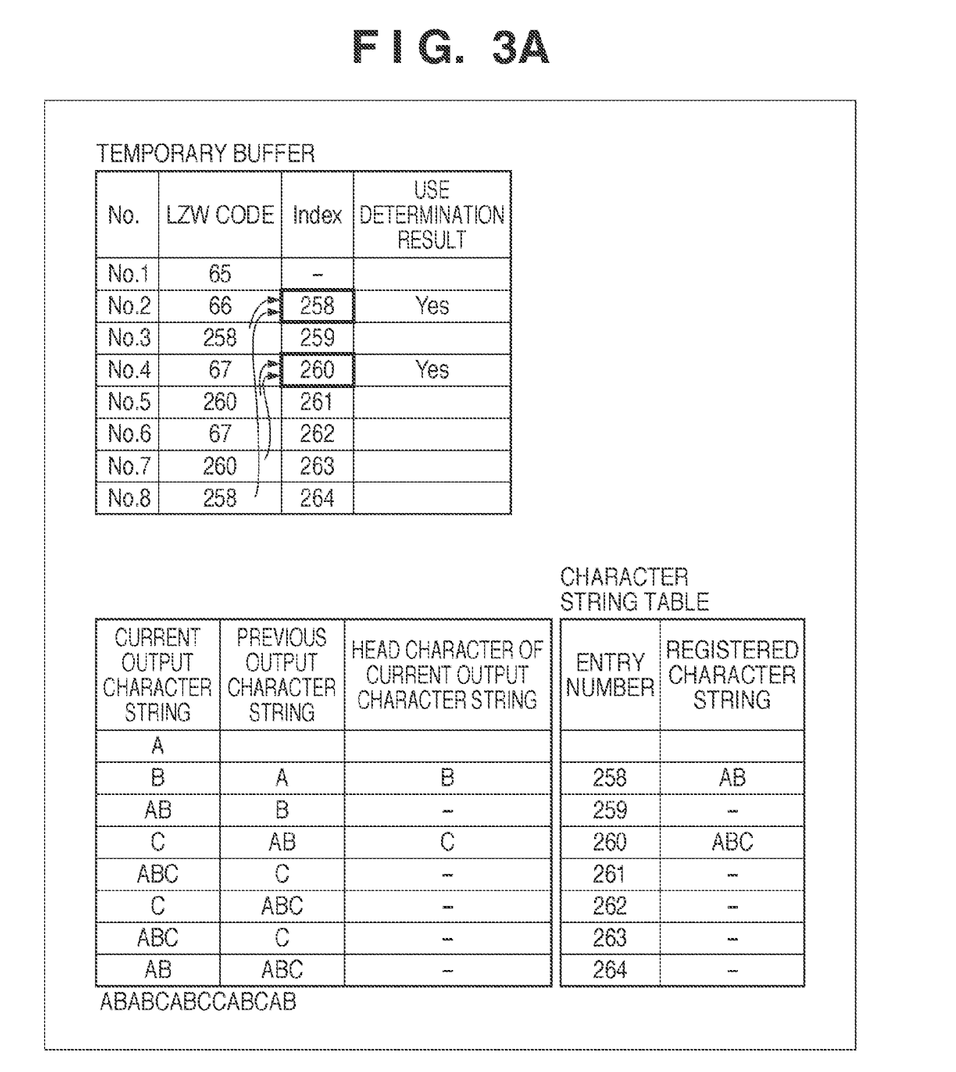
FIGS. 3A and 3B are explanatory views of the LZW code decompression processing.
Figure 3B:
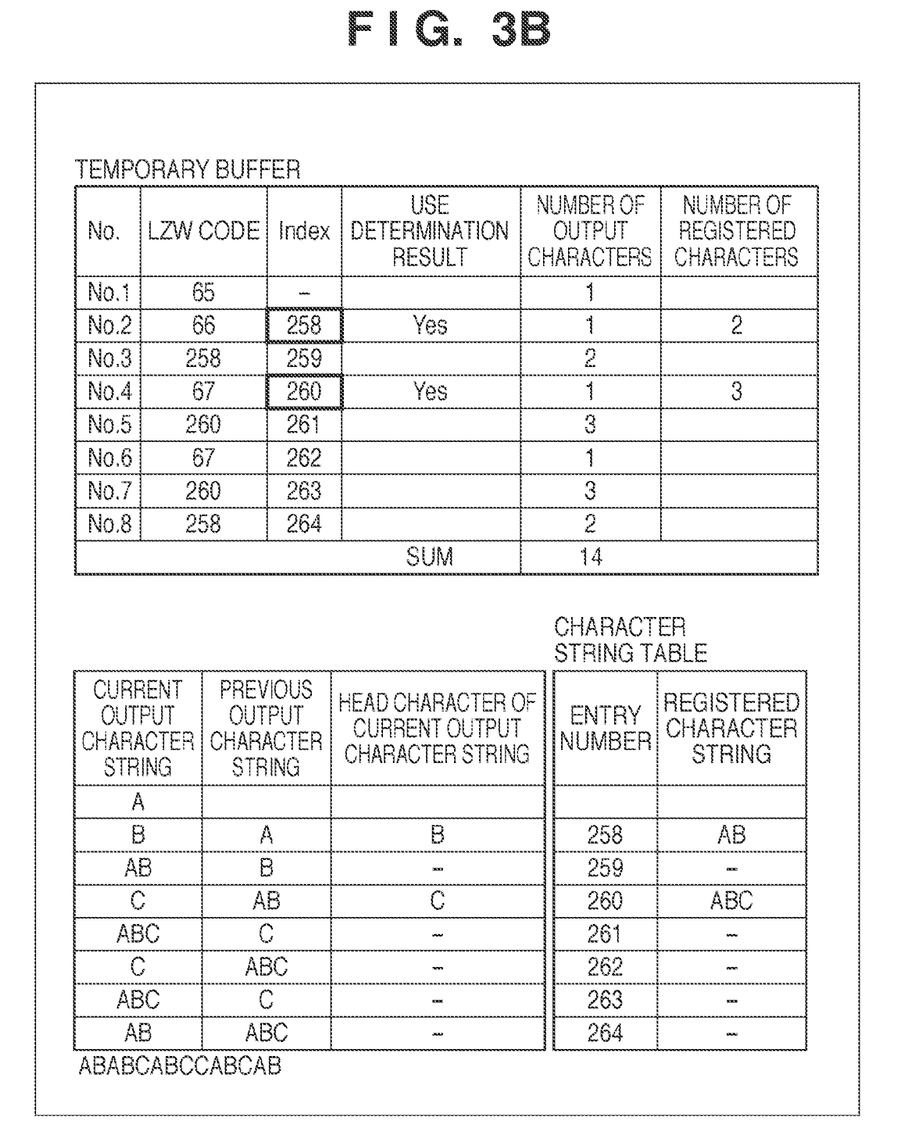
Figure 4:
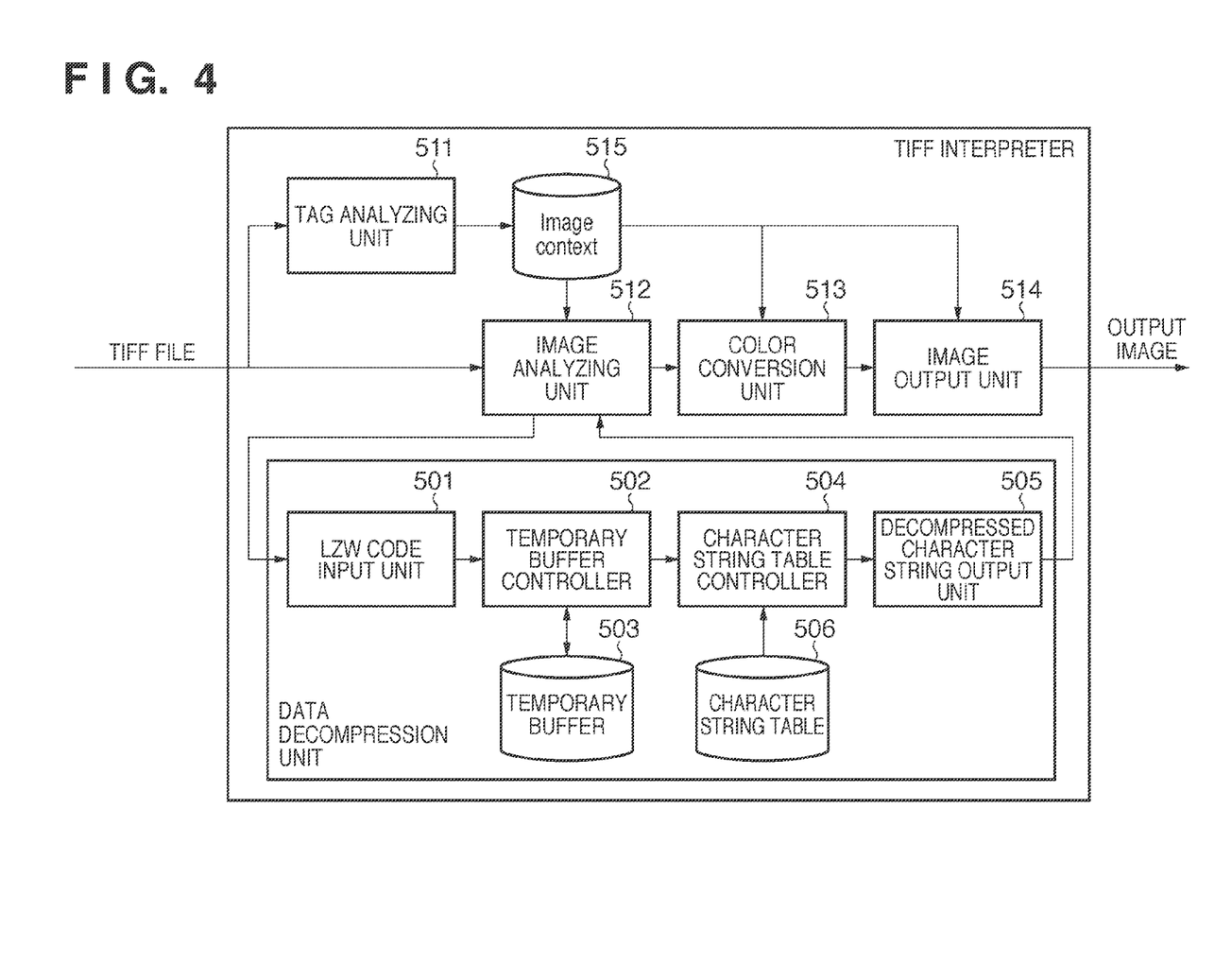
FIG. 4 is a block diagram showing a functional configuration.

Hereinbelow, LZW code decompression processing in the present embodiment will be described in detail by using mainly FIGS. 2A and 2B, FIGS. 3A and 3B, and FIG. 4. FIGS. 2A and 2B are flowcharts showing procedures of the LZW code decompression processing in the present embodiment. FIGS. 3A and 3B are explanatory views of the LZW code decompression processing. FIG. 4 is a block diagram showing a functional configuration when the system in FIG. 1 functions as a "TIFF interpreter to restore an image from a TIFF file". That is, FIG. 4 corresponds to a functional view of the above-described FIG. 1.

First, the functional configuration in FIG. 4 will be described. A TIFF file inputted into the TIFF interpreter in the figure is stored on a predetermined storage medium corresponding to the hard disk 103. A temporary buffer 503, a character string table 506 which functions as a "dictionary", and an image context 515 are allocated on the memory 102 with the processor 101. A tag analyzing unit 511, an image analyzing unit 512, a color conversion unit 513, a temporary buffer controller 502, a character string table controller 504 and the like are held on the memory 102 or the hard disk 103 as a part of the above-described program. Further, various input and output units correspond to a data input/output function of the memory 102, the hard disk 103 or the processor 101. An output image which corresponds to a finally-utilized color bitmap data is held on the hard disk 103 or the memory 102. Note that the present embodiment may be executed by using a single storage medium in place of the two storage media, the memory 102 and the hard disk 103. The series of processing performed in FIG. 4 is started with the processor 102 in accordance with an instruction input from the keyboard 104 or the pointing device 105 shown in FIG. 1 or an instruction signal received from the network 110. When the TIFF interpreter detects the above-described instruction, it inputs a designated TIFF file. The tag analyzing unit 511 analyzes information called "tag information" included in the developed TIFF file 510 to be expanded. The analyzed tag information is held, as the image context 515, on a predetermined storage medium. The tag information includes information to represent resolution of an encoding subject image, color space represented with the image data, the compression coding method, layout information and the like. The image analyzing unit 512 processes the image data included in the TIFF file 510 based on the tag information stored in the image context 515, and outputs the processed image data to the color conversion unit 513. When it is determined based on the compression coding method in the tag information that the image data is LZW compressed data, the image analyzing unit 512 outputs the compressed image data to a data decompression unit to be described later. Further, the image analyzing unit 512 inputs the image data decompressed with the data decompression unit, and outputs the data to the post-stage color conversion unit 513 as undecompressed image data. The data decompression unit has the LZW code input unit 501, the temporary buffer controller 502, the temporary buffer 503, the character string table controller 504, the decompressed character string output unit 505, the character string table 506 and the like. The decompression processing with these units will be described in detail later. Note that as the data decompression unit in FIG. 4, only the function to decompress LZW compressed data is shown, however, other known compressed images such as compressed images in ZIP, MH, MR, MMR, JPEG formats can be decompressed with the unshown data decompression function. The color conversion unit 513 inputs the image data processed with the image analyzing unit 512 (e.g. image data obtained by decompressing the LZW compressed image data). Then the color conversion unit 513 converts the input image data based on the above-described tag information to appropriate color space image data as an output image. The image output unit 514 performs processing such as conversion of the image data outputted from the color conversion unit 513 to image data having necessary resolution as an output image, then outputs the processed image data as an output image. The output image is displayed on the display unit 108 in FIG. 1, or outputted from the network 110 to an external device.

Next, LZW code decompression processing by the above-described data decompression unit will be described using the flowcharts of FIGS. 2A and 2B. The series of processing is realized by loading the program stored on the hard disk 103 in FIG. 1 or the like to the memory 102 and executing the program by the processor 101. FIG. 2A shows the entire processing.

First, at step S201, the LZW code input unit 501 obtains one only 1 codeword from the LZW encoded data, from the image analyzing unit 512. At step S202, the temporary buffer controller 502 obtains the above-described LZW code for 1 codeword from the LZW code input unit 501, and determines whether or not the obtained LZW code is a clear code ("256" in decimal notation) or an end code ("257" in decimal notation). Note that the clear code is a code indicating initialization of a character string table (dictionary). Further, the end code is a code indicating termination of decompression processing. At step S202, when it is determined that "the obtained LZW code is a clear code or an end code", the process perform processings at steps S203 to S209. When it is determined at step S202 that "the obtained LZW code is not a clear code nor an end code", the process skips steps S203 to S208 to perform the processing at step S209.

At step S203, the temporary buffer controller 502 refers to the LZW code held on the temporary buffer 503 at step S209 to be described later, and determines "whether or not respective character strings in the character string table actually appear". As described above, in LZW code decompression, a character string which is not actually encoded as a LZW code is often registered in the character string table. At step S204, the character string table controller 504 and the decompressed character string output unit 505 perform decompressed data output processing to be described later. At step S205, the temporary buffer controller 502 determines whether or not the LZW code obtained at step S201 is an end code. When it is determined that the LZW code is an end code, the temporary buffer controller 502 terminates the decompression processing (code output to the character string table controller 504 and the decompressed character string output unit 505). At step S206, the temporary buffer controller 502 initializes the temporary buffer 503. At step S207, the LZW code input unit 501 obtains LZW code data for 1 code. At step S208, the temporary buffer controller 502 determines whether or not the LZW code obtained at step S207 is an end code. When it is determined that the LZW code is an end code, the temporary buffer controller 502 terminates the decompression processing. When it is determined that the LZW code is not an end code, the process proceeds to step S209. At step S209, the temporary buffer controller 502 stores the 1 LZW code in the temporary buffer 503. More particularly, when NO at step S202, the temporary buffer controller 502 stores the 1 LZW code obtained at step S201. Further, when NO at step S208, the temporary buffer controller 502 stores the 1 LZW code obtained at step S207.

Next, the details of the decompressed data output processing at the above-described step S204 will be described in accordance with the flowchart of FIG. 2B. At step S211, the character string table controller 504 obtains the 1 LZW code for 1 code stored in the temporary buffer 503. At step S212, the character string table controller 504 determines whether or not the LZW code is a head character stored in the temporary buffer 503. When it is determined that the LZW code indicates a head character, the process proceeds to step S213. At step S212, when it is determined that the LZW code is not a head character, the process proceeds to step S217. At step S213, the decompressed character string output unit 505 outputs a character string corresponding to the above-described LZW code from the character string table 506. At step S214, the character string table controller 504 initializes the character string table 506. At step S215, the character string table controller 504 stores the character string, currently decoded and outputted at step S213, as a previously decoded and outputted character string. At step S217, the decompressed character string output unit 505 refers to the character string table 506, and outputs a character string corresponding to the obtained LZW code.

At step S218, the character string table controller 504 performs the following control based on the result of determination at step S203 i.e. "the respective character strings in the character string table actually appear or not (is to be used or not to be used)".

At step S218, when it is determined that "to be used", the process proceeds to step S219. At step S219, the character string table controller 504 additionally registers a new character string, obtained by adding the head character of the currently decoded and outputted character string to the previously decoded and outputted character string, in the character string table 506. At step S216, the character string table controller 504 determines whether or not the above-described respective steps (S211 to 5215 and 5217 to 5219) have been selectively performed with respect to all the LZW codes. When it is determined that an unprocessed LZW code remains, the process returns to step S211 to repeat the above-described processing. When it is determined that no unprocessed LZW code remains, the process ends.

Next, the decompression processing with the data decompression unit in accordance with the procedures shown in FIGS. 2A and 2B will be described with reference to particular processing subject data shown in FIG. 3A. Note that for the sake of simplification of explanation, LZW codewords inputted into the data decompression unit in FIG. 4 are "256, 65, 66, 258, 67, 260, 67, 260, 258 and 257".

The LZW codes are held on the temporary buffer 503 until the LZW code input unit 501 and the temporary buffer controller 502 detect appearance of a clear code or an end code. The particular procedure of the processing is as follows. First, at step S201, the initial LZW code "256" is inputted. Since this is a clear code, the result of determination at step S202 is "YES", and step S203 is performed. At step S203, an LZW code used in correspondence with the contents of the temporary buffer 503 is obtained. At this stage, there is no code substituted into the temporary buffer, no processing is performed. Similarly, at step S204, since the temporary buffer 503 is empty, no processing is performed. Since the LZW code received at step S201 is not an end code, the result of determination at step S205 is "NO", and step S206 is performed. At step S206, the temporary buffer 503 is initialized. At step S207, the second LZW code "65" is inputted. Since this is not an end code, the result of determination at step S208 is "NO", then step S209 is performed. At step S209, the LZW code "65" is registered (stored) in the temporary buffer 503, and the process returns to step S201.

Next, the third LZW code "66" is inputted at step S201. Since this is not a clear code, step S209 is performed based on the result of determination at step S202. At step S209, the LZW code "66" is registered in the temporary buffer 503, and the process returns to step S201.

Similarly, the respective LZW codes "258", "67", "260", "67", "260" and "258" are sequentially registered in the temporary buffer 503 through the same sequence as that in the above-described case of the LZW code "66". At this time, the codeword group "65, 66, 258, 67, 260, 67, 260 and 258" is registered in the temporary buffer 503.

Thus, when the final LZW code "257" is inputted at step S201, since this code is an end code, the process proceeds from step S202 to step S203.

Next, at step S203, it is determined whether or not an LZW codeword to be decoded by reference to the character string table 506 (dictionary) is included in the temporary buffer. An LZW codeword to be decoded by reference to the character string table 506 has a value equal to or greater than "258". Accordingly, the codewords stored in the temporary buffer are read in the order of storage, and when the value of a read codeword is equal to or greater than "258", the codeword is regarded as a codeword to be decoded by reference to the character string table 506. In the embodiment, among the LZW codewords stored in the temporary buffer, the value of two codewords equal to or greater than "258" are "258" and "260". Then "YES" is stored in the field "Use Determination Result" corresponding to "index" having these values. The types of the LZW codewords registered in the temporary buffer are, except overlapped ones, "65, 66, 67, 258 and 260".

The above processing will be described in more detail. Regarding the code No. 1 as a head of the LZW codes registered in the temporary buffer 503, addition to the character string table 506 is not performed. Then regarding No. 2 and the subsequent codes, there is a probability of registration in the character string table 506. Accordingly, as shown in FIG. 3A, in the temporary buffer, index numbers are assigned sequentially from "258", to the No. 2 and the subsequent LZW codes. That is, an index number "259" is assigned to the LZW code No. 3; "260", to the LZW code No. 4; and "261", to the LZW code No. 5. Regarding the subsequent LZW codes, index numbers are assigned in a similar manner. Note that the index numbers are not actually stored in the table. The figure provides illustration only to assist understanding.

On the other hand, the LZW codes which actually appear in the temporary buffer and decoded by reference to the character string table 506 (codes with codeword value equal to or greater than "258") are "258" and "260". Assuming that the values of the LZW codes are the above-described index numbers, the LZW codewords having these values are No. 2 and No. 4. Accordingly, as shown in FIG. 3B, to indicate that the LZW codes Nos. 2 and 4 in the temporary buffer are subjects of registration in the character string table, a "YES" flag (identification information) is added to the item "use determination result". In other words, the codeword corresponding to the "YES" flag added to the item "use determination result" can be called a "character string table reference codeword".

Note that regarding a codeword having a value equal to or less than "255", as the LZW code and the character string to be outputted are the same, registration in the dictionary is not required. Further, since the code "256" is a clear code and the code "257" is an end code, it is determined whether or not the LZW codes having a value equal to or less than "258" appear in the temporary buffer.

Next, as the content of step S204, the decompressed data output processing is performed based on the temporary buffer 503. The data decompression processing is similar to the conventional technique, however, regarding the registration in the character string table 506, only the entry numbers "258" and "260" can be registered based on the flag value in accordance with the result of previous use determination.

The particular flow of the processing will be described. Note that in this example, a counter for sequentially reading codes from the temporary buffer 503 is provided. The codeword indicated with the counter is inputted from the temporary buffer 503, and the count value is incremented for input of the next code.

First, at step S211, the No. 1 LZW code "65" is inputted from the temporary buffer 503. Since this is a head code in the temporary buffer, step S213 is performed based on the result of the determination at step S212. At step S213, a character string corresponding to "65" is outputted as a decoding result. As described above, a character string corresponding to an LZW code having a value equal to or less than "255" is the LZW code itself, "65" ("41H" in hexadecimal notation xxH) is outputted as a character code of a character "A". Then at step S214, the character string table 506 is initialized. At step S215, the character "A" is held as a previously decoded and outputted character string. Since the temporary buffer 503 still holds an LZW code, step S211 is performed based on the result of determination at step S216.

Next, at step S211, the No. 2 LZW code "66" is inputted. Since this is not a head code in the temporary buffer, the result of determination at step S212 is "NO", and step S217 is performed. At step S217, as the LZW code has a value equal to or less than "255", the LZW code itself is outputted. That is, "66" is outputted as a character code of a character "B". Regarding this No. 2 code, as an LZW code referred to in the temporary buffer is registered, the result of determination at step S218 is "YES", and step S219 is performed. In this case, the code of interest is the second code and the counter value is "2". Accordingly, the entry number in the character string table 506 is "256"+"2"="258". The previously decoded and outputted character string "A" and the head character of the currently decoded and outputted character string "B" are coupled as a new character string "AB", and the new character string is registered in an entry address position "258" of the character string table 506. Note that since the entry address "258" is also used as an index in the temporary buffer in FIG. 3A, it may be utilized. At step S215, "B" is registered as a previously decoded and outputted character string. Since the temporary buffer 503 still holds an LZW code, step S211 is performed based on the result of determination at step S216. At this time, the character string to be outputted is "AB".

Next, at step S211, the No. 3 LZW code "258" is inputted. Since this is not a head code in the temporary buffer, step S217 is performed based on the result of determination at step S212. As the LZW code has a value equal to or greater than 258, the character string "AB" corresponding to the entry address position "258" is referred to from the character string table 506 and is outputted as a decoding result. Since it is determined regarding the No. 3 code that registration in the character string table 506 is not necessary, step S215 is performed based on the result of determination at step S218. At step S215, "AB" is registered as a previously decoded and outputted character string. Step S211 is performed based on the result of determination at step S216. At this time, the total character string to be outputted is "ABAB".

At step S211, the No. 4 LZW codeword "67" is inputted. Since this is not a head code in the temporary buffer, step S217 is performed based on the result of determination at step S212. At step S217, as in the case of the above-described code, since the LZW code has a value equal to or less than "255", the LZW code itself is outputted. That is, "67" is outputted as a character code of a character "C". Regarding the No. 4 LZW code, since it is determined that an LZW code referred to in the temporary buffer (as the flag of use determination result is "YES") is registered, step S219 is performed. In this case, the code of interest is the fourth code and the counter value is 4. Accordingly, the entry address is 256+4=260. Therefore, at step S219, the previously decoded and outputted character string "AB" and a head character "C" of the currently decoded and outputted character string "C" are coupled as "ABC" and registered in the entry address position "260" of the character string table 506. At step S215, "C" is registered as a previously decoded and outputted character string. As the temporary buffer 503 still holds an LZW code, step S211 is performed based on the result of determination at step S216. At this time, the total character string to be outputted is "ABABC".

At step S211, the No. 5 LZW code "260" is inputted. Since this is not a head code in the temporary buffer, step S217 is performed based on the result of determination at step S212. As this LZW code has a value equal to or greater than "258", the character string "ABC" corresponding to the entry number 260 is referred to from the character string table 506 and outputted. Regarding the No. 5 LZW code, as it is determined that registration in the character string table 506 is not necessary, step S215 is performed based on the result of determination at step S218. At step S215, "ABC" is registered as a previously decoded and outputted character string. Step S211 is performed based on the result of determination at step S216. At this time, the total character string to be outputted is "ABABCABC".

At step S211, the No. 6 LZW code "67" is inputted. Since this is not a head code in the temporary buffer, step S217 is performed based on the result of determination at step S212. At step S217, as in the case of the above-described code, since the LZW code has a value equal to or less than "255", the LZW code itself is outputted. That is, "67" is outputted as a character code of a character "C". Regarding the No. 6 LZW code, it is determined that registration in the character string table 506 is not necessary, step S215 is performed based on the result of determination at step S218. At step S215, "C" is registered as a previously decoded and outputted character string. Step S211 is performed based on the result of determination at step S216. At this time, the total character string to be outputted is "ABABCABCC".

At step S211, the No. 7 LZW code "260" is inputted. Since this is not a head code in the temporary buffer, step S217 is performed based on the result of determination at step S212. At step S217, since the LZW code has a value equal to or less than "258", a character string "ABC" corresponding to the entry number 260 is referred to from the character string table 506 and outputted. Regarding the No. 7 LZW code, it is determined that registration in the character string table 506 is not necessary, step S215 is performed based on the result of determination at step S218. At step S215, "ABC" is registered as a previously decoded and outputted character string. Step S211 is performed based on the result of determination at step S216. At this time, the total character string to be outputted is "ABABCABCCABC".

At step S211, the No. 8 LZW code "258" is inputted. Since this is not a head code in the temporary buffer, step S217 is performed based on the result of determination at step S212. Since the LZW code has a value equal to or greater than "258", the character string "AB" corresponding to the entry number "258" is referred to from the character string table 506 and outputted as a decoding result. Regarding the No. 8 LZW code, it is determined that registration in the character string table 506 is not necessary, step S215 is performed based on the result of determination at step S218. At step S215, "AB" is registered as a previously decoded and outputted character string.

Since all the buffer contents have been processed as above, based on the result of determination at step S216, the present processing ends. At this time, the total character string to be outputted is "ABABCABCCABCAB".

The processing at step S204 ends here, then the processing at step S205 continues. Since the LZW code inputted at step S201 is an end code, based on the result of determination at step S205, the LZW expansion processing ends.

As described above, it is possible to register only character strings corresponding to entry numbers for actual use in the character string table. As generation of character string for registration in the character string table is omitted, the processing can be simplified. Further, as the number of times of registration in the character string table is reduced, overgrowth of the character string table can be suppressed. Accordingly, it is possible to realize efficient LZW code data decompression processing in the present embodiment.

Figure 5A:
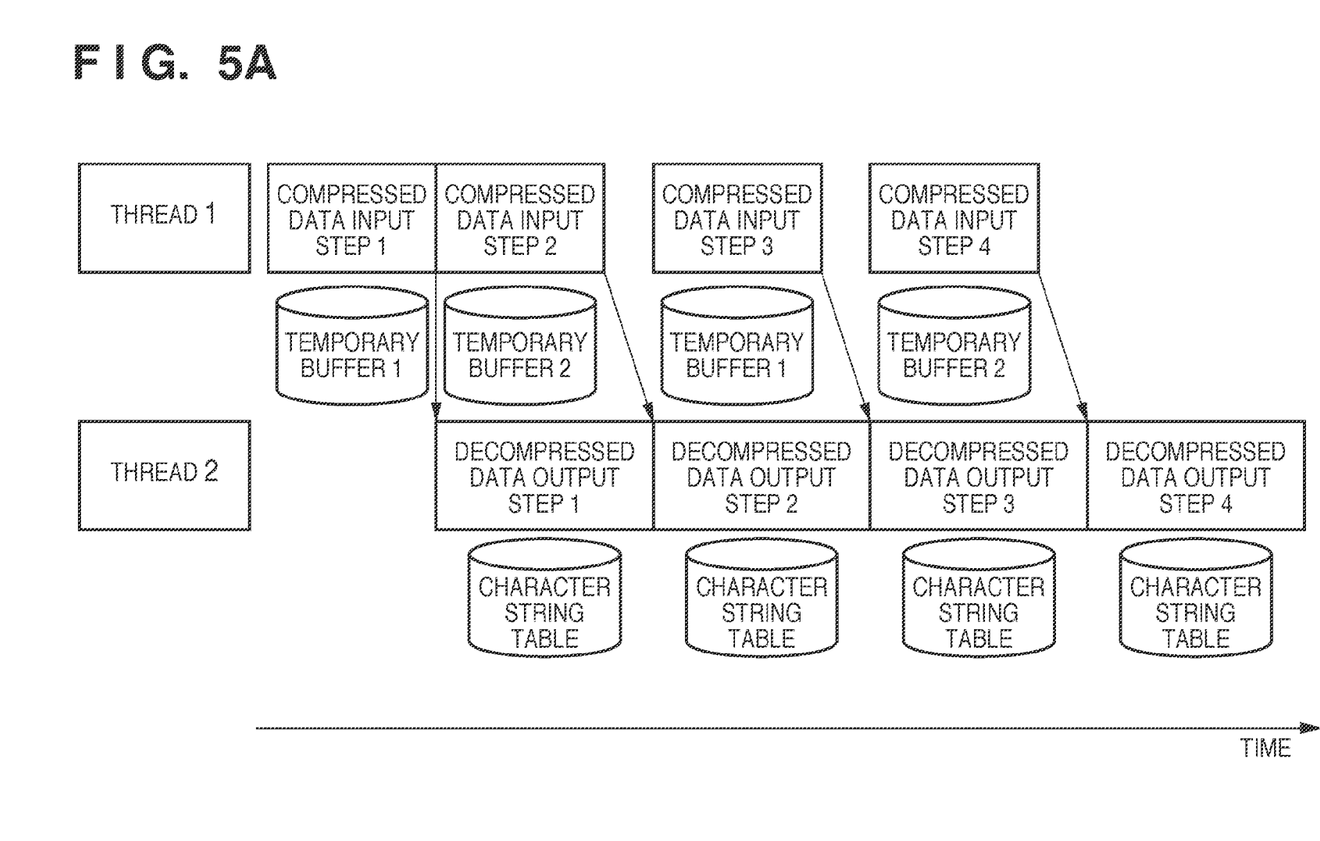
FIGS. 5A and 5B are explanatory views showing an example of parallel decompression processing.

Note that it may be arranged such that decompression data output processing is performed in a parallel manner during compressed data input processing (see FIG. 5A). For example, two temporary buffers are prepared (a temporary buffer 1 and a temporary buffer 2). When compressed data input step with respect to the temporary buffer 1 has been completed, then decompressed data output step referring to the temporary buffer 1 can be started. At the same time, compressed data input step can be started with respect to the other temporary buffer 2. This arrangement realizes LZW 2-parallel decompression processing to perform two processes in parallel. Note that the number of temporary buffers is not specially limited, but three or more temporary buffers can be used.

Figure 5B:
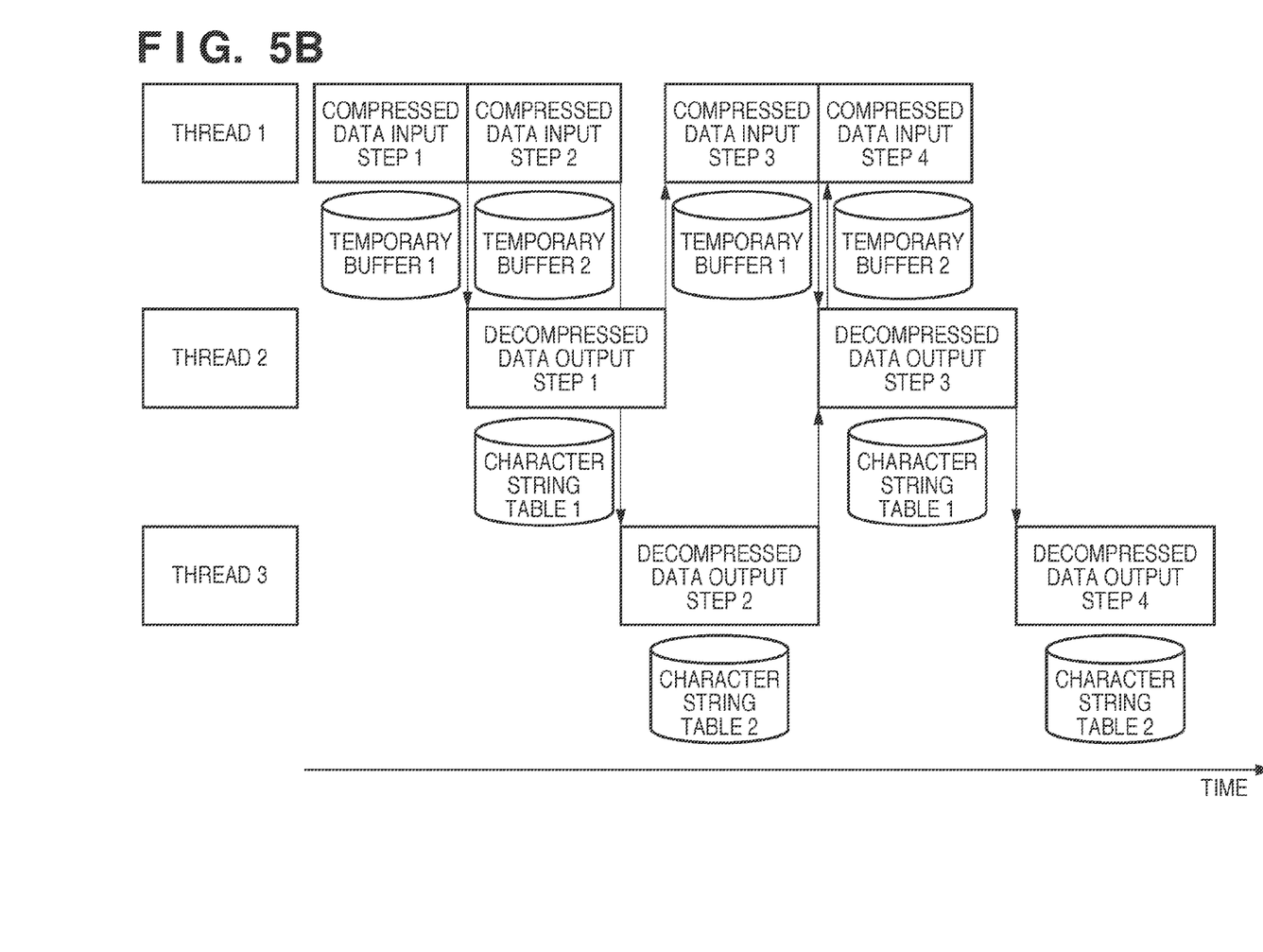

Further, it may be arranged such that plural decompressed data output processings are performed in a parallel manner during the compressed data input processing (see FIG. 5B). To realize this arrangement, it is preferable to add registration character string length information in the temporary buffer 503. When the use determination result has been recorded, the LZW codes in the temporary buffer are scanned so as to sequentially calculate decompressed character string lengths (see FIG. 3B). When an LZW code has a value equal to or less than 255, "1", while when the LZW code has a value equal to or greater than 256, a previous output character string length plus "1", becomes an output character string length. By obtaining the total sum of the output character string lengths, a decompressed data length upon decompression of an LZW code in the temporary buffer can be calculated. With this arrangement, the total sum of decompressed data lengths can be calculated without using an actual decompressed character string output unit in the temporary buffer controller. Using this information, it is possible to obtain a decompressed data output length upon compressed data input processing and to determine a decompressed data output position based on the above-described decompressed data output length with the respective decompressed data output units. Accordingly, it is possible to perform decompression from an arbitrary position and to simultaneously perform plural decompressed data output processes. Note that it may be arranged such that three or more temporary buffers and character string tables are provided for simultaneous execution of plural decompressed data output processings. Further, it may be arranged such that when the respective decompressed data output processings have been performed, the outputted data are coupled without obtaining decompressed character string length.

Further, as a preferable usage of the present invention, an application to TIFF file plane sequential data decompression processing will be described. In the TIFF file format, pixel information can be stored in a point sequential or plane sequential manner. For example, when a pixel is represented using three RGB primary colors, pixel information is arrayed as RGBRGBRGB . . . in the point sequential manner, while as RRR . . . GGG . . . BBB in the plane sequential manner. However, in the LZW decompression, as a character string table is dynamically generated during decoding processing (during decompression processing), it is impossible to recognize an actually decompressed character string from an LZW code without actual decompression to a decompressed character string (i.e. without generation of character string table). In conventional techniques, it is difficult to specify a compressed data start position in respective planes. Accordingly, when plane sequential data is decompressed for 1 plane, then the data is rearranged to point sequential data. However, in the case of an A4 sized 600 dip and 24 bpp RGB image, the storage area necessary for representation of 1 plane is 100 MB. When the memory capacity is increased by the above processing, the product cost may be increased. Further, when an image in higher resolution (1200 dip or 2400 dpi), or in five or more colors including CMYK color space or special color is handled, a necessary storage area is further increased so as to support a large print sheet size such as A3.

Figure 6A:
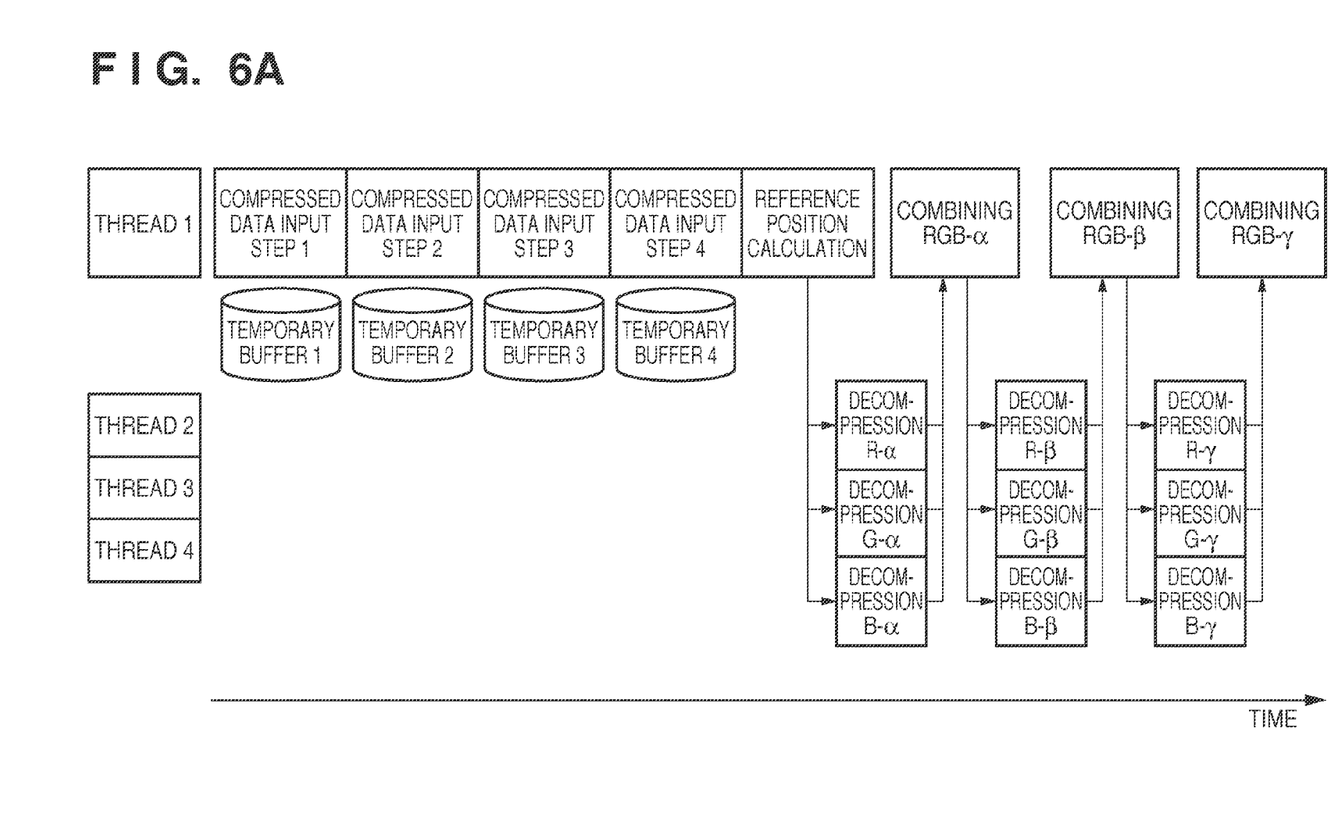
FIGS. 6A and 6B are explanatory views showing an example of color image decompression processing.
Figure 6B:
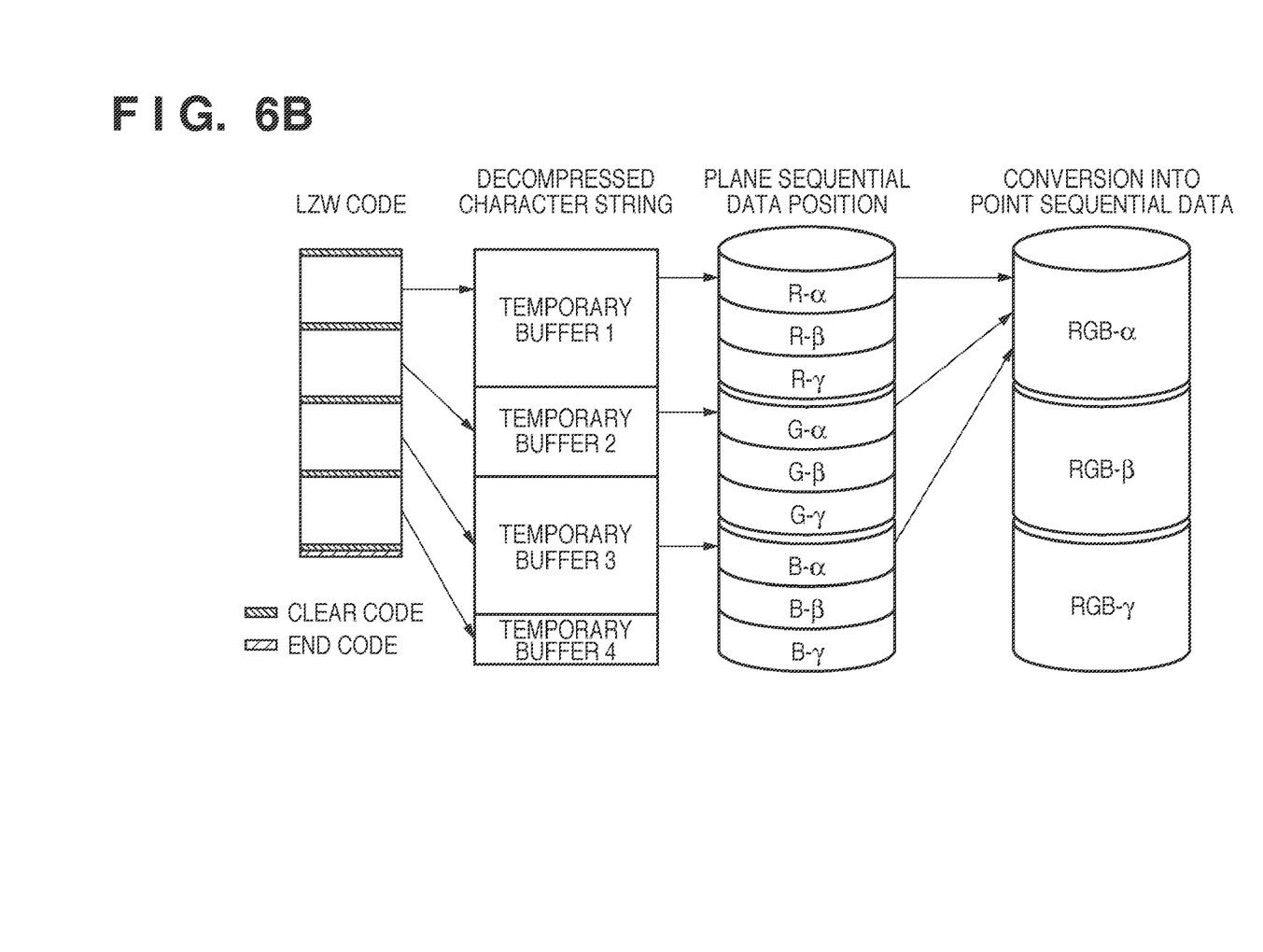

The present invention effectively works regarding the above objects. FIG. 6A shows the flow of processing upon application of the present invention, and FIG. 6B, the flow of data. In the present invention introducing a temporary buffer, as described above, it is possible to previously calculate a data length upon decompression in the temporary buffer by using a temporary buffer controller. Based on the calculated data length, when plane sequential data is decompressed, it is possible to specify a compressed data position where each plane is started with a temporary buffer controller. Accordingly, as data decompression can be performed from plural compressed data positions, conversion to point sequential data can be performed without decompression of all the pixel information. The flow of the processing will be described in accordance with FIGS. 6A and 6B. First, an arbitrary number (or size) to divide final decompressed data is determined. In this example, the final decompressed data is divided into three data, α, β and γ. Next, compressed data input process is performed with respect to temporary buffers 1 to 4. Decompressed data lengths when the input results in the respective temporary buffers 1 to 4 are decompressed are obtained. Then start positions of the data to be decompressed with respect to the respective planes are obtained from the obtained decompressed data length. In this example, in the thread 2, the head to R-α of the temporary buffer 1 is decompressed; in the thread 3, from the middle to G-α of the temporary buffer 2 is decompressed; and in the thread 4, the middle to B-α of the temporary buffer 3 is decompressed. When an LZW code is referred to from the middle, the character string table registration processing to that point is performed in advance. When the decompression processings with respect to the partial data in the respective planes have been completed, the decompressed data are rearranged, thereby point sequential data are generated. With this arrangement, it is possible to perform decompression processing even on a large amount of plane sequential data with a comparatively small memory capacity. Further, it is possible to realize more efficient processing by combining the above-described processing with parallel decompression processing, however, in essentials, it is possible to attain the reduction of memory capacity by sequential processing on one thread.

As described above, by introducing a temporary buffer, the individuality of the compressed data input processing and the decompressed data output processing can be established. This avoids registration of character string which is not referred to in a character string table upon expansion processing, thereby realizes efficient expansion processing.

The apparatus described in the above embodiment processes data encoded using a coding algorithm to convert a coding subject character string into a codeword by referring to a character string table. Upon coding, based on an encoded character string, a character string predicted to appear thereafter and its codeword are previously registered in the character string table. The apparatus has an input unit to input the encoded data. Further, the apparatus has a specifying unit to specify a codeword included in the inputted encoded data among codewords (corresponding to all "258" and subsequent numbers in the dictionary) registered in the character string table upon coding. The apparatus also has an output unit to output information indicating the specifying result before decoding of the encoded data. Then, based on the specifying result, a part of process to register a character string in the "dictionary" is skipped. With this arrangement, high speed decoding processing can be realized.

Other Embodiments

Note that in the above-described embodiment, an example of LZW coding has been given, however, the present invention is not limited to the LZW coding but is applicable to various coding algorithms to convert a coding subject character string into a codeword by referring to a character string table which functions as a "dictionary". Accordingly, for example, the present invention is applicable to, in addition to LZW coding, LZ78 coding and the like.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-041002, filed Feb. 25, 2010, which is hereby incorporated by reference herein in its entirety.

What is claimed is:

1. An information processing apparatus which processes encoded data encoded using a coding algorithm to convert a coding subject character string into a codeword by referring to a character string table, comprising:
   an input unit to input said encoded data;
   a specifying unit to specify a codeword included in said inputted encoded data among codewords to be registered in a character string table upon coding; and
   an output unit to output information indicating the specified result by said specifying unit before decoding of said encoded data,
   wherein said coding is LZW coding, and wherein, upon said coding, a coupled character string, obtained by coupling a character string encoded as one codeword and its subsequent one character, is registered as said "character string predicted to subsequently appear" in said character string table.

2. The apparatus according to claim 1, further comprising a decoding unit to decode said encoded data by referring to a character string table for decoding,
   wherein, based on said decoded character string, a character string to be subsequently decoded and its codeword, linked to each other, are registered in said character string table for decoding.

3. The apparatus according to claim 2, wherein in said decoding unit, based on said specified result, a character string corresponding to a codeword not included in said encoded data is not registered in said character string table for decoding.

4. An information processing apparatus which decompresses LZW-encoded compressed data, comprising:
   an input unit to input LZW encoded compressed data by 1 codeword, and store the compressed data in a temporary buffer until it is determined that the input codeword is a clear code or an end code in the LZW code;
   a generation unit to, when it is determined that said input codeword is said clear code or said end code, specify a table reference codeword for reference to an LZW code in a character string table from a codeword group already stored in said temporary buffer, and generate identification information to specify a codeword of the codeword group in said temporary buffer which is a codeword as a subject of registration in said character string table from said table reference codeword;
   a decoding unit to, when a codeword read from said temporary buffer is said table reference codeword, output a character string in an entry address position of said character string table indicated with said codeword as a decoding result, and when the codeword read from said temporary buffer is a codeword not to be decoded by reference to said character string table, output said character string indicated with said code as a decoding result;
   a determination unit to, during decoding by said decoding unit, determine whether or not the codeword read from said temporary buffer is a subject of registration in said character string table, by referring to said identification information; and
   a registration unit to, when said determination unit determines that the code word read from said temporary buffer is the subject of registration in said character string table, register a new character string, obtained by adding a head character of a currently decoded and outputted character string to a previously decoded and outputted character string, in the entry address position of said character string table indicated with the codeword read from said temporary buffer.

5. The apparatus according to claim 4, wherein the apparatus has at least two said temporary buffers, and utilizes one of said temporary buffers for decompression processing of encoded data stored by detection of the previous clear code, while utilizes the other one of said temporary buffers for storage of new LZW encoded data to said clear code or said end code by said input unit.

6. The apparatus according to claim 4, further comprising a control unit to, upon storage of a codeword in said temporary buffer, calculate a data length of a character string obtained with said decoding unit with respect to said codeword, and based on the data length, control an output position of said codeword.

7. A non-transitory computer readable storage medium holding a program, read and executed by a computer, thereby causing said computer to function as the information processing apparatus in claim 4.

8. A control method for an information processing apparatus which decompresses LZW encoded compressed data, comprising:
   an input step of inputting LZW encoded compressed data by 1 codeword, and storing the compressed data in a temporary buffer until it is determined that the input codeword is a clear code or an end code in the LZW code;
   a generation step of, when it is determined that said input codeword is said clear code or said end code, specifying a table reference codeword for reference to an LZW code in a character string table from a codeword group already stored in said temporary buffer, and generating identification information to specify a codeword of the codeword group in said temporary buffer as a registration subject codeword in said character string table from said table reference codeword;
   a decoding step of, when a codeword read from said temporary buffer is said table reference codeword, outputting a character string in an entry address position of said character string table indicated with said codeword as a decoding result, and when the codeword read from said temporary buffer is a codeword not to be decoded by reference to said character string table, outputting said character string indicated with said code as a decoding result;

a determination step of, during decoding at said decoding step, determining whether or not a codeword read from said temporary buffer is a registration subject in said character string table, by reference to said identification information; and a registration step of, when it is determined at said determination step that the code word read from said temporary buffer is the subject of registration in said character string table, registering a new character string, obtained by adding a head character of a currently decoded and outputted character string to a previously decoded and outputted character string, in the entry address position of said character string table indicated with the codeword read from said temporary buffer.

\* \* \* \* \*